United States Patent [19]

Long et al.

[11] Patent Number: 4,745,350

[45] Date of Patent: May 17, 1988

[54] DEVICE FOR AND METHOD OF MODULATING AN ELECTRIC CURRENT PULSE

[75] Inventors: James R. Long, La Jolla; Kenneth G. Lindner, San Diego, both of Calif.

[73] Assignee: Energy Compression Research Corporation, Del Mar, Calif.

[21] Appl. No.: 64,555

[22] Filed: Jun. 22, 1987

[51] Int. Cl.$^4$ .............................................. G05F 1/70
[52] U.S. Cl. .................................. 323/209; 323/355
[58] Field of Search ................ 323/209, 344, 345, 355

[56] References Cited

U.S. PATENT DOCUMENTS

| | | | |
|---|---|---|---|
| 4,079,305 | 3/1978 | Peterson et al. | 363/14 X |
| 4,431,960 | 2/1984 | Zucker | 323/340 |
| 4,482,816 | 11/1984 | Richardson et al. | 307/106 |
| 4,496,924 | 1/1985 | Richardson | 336/84 R |

OTHER PUBLICATIONS

Charactéristiques des Transferts Inductifs a Haut Rendement par Procédé Dissipatif, by M. Lengentil et C. Rioux, Revue de Physique Appliquée, Mar. 1976.
Théorie Simplifiee des Procédéd de Transfert Inductif a Haut Rendement by C. Rioux, Revue de Physique Appliquée, Mar. 1975.

Primary Examiner—Patrick R. Salce
Assistant Examiner—Marc S. Hoff
Attorney, Agent, or Firm—Marks Murase & White

[57] ABSTRACT

Device for and method of modulating an electric current pulse in which an inductor is shunted by a closing switch element in order to define a loop. The loop is then opened, which magnetically transfers energy stored in the inductor to the other inductor elements. Included in the loop is a constant voltage opening switch element which limits the potential difference across an opening switch in the loop. Proper selection of the number of such loops included in the device, the inductance of the inductor elements, and the voltage for the constant voltage opening switch elements permits tailoring of the resultant current pulse to any load in any predetermined shape, including a square pulse in which current is maintained constant for the duration of the pulse.

18 Claims, 7 Drawing Sheets

DEVICE FOR AND METHOD OF MODULATING AN ELECTRIC CURRENT PULSE

BACKGROUND OF THE INVENTION

I. Field of the Invention

The present invention relates generally to a device for and method of transferring energy from a source of electrical energy to a load of any given impedance, fixed or varying, in a predefined pulse shape.

The invention finds application, for example and without limitation, in the fields of repetitive pulse power applications and power conditioning.

II. Background of the Invention

There is presently a need to deliver specifically-shaped current pulses to a wide variety of loads. One pulse shape of particular interest for a variety of applications is a square pulse in which load current remains constant over the duration of the pulse. Present devices which achieve such a constant current pulse are classical modulators or pulse forming networks (PFNs).

Figure 1:
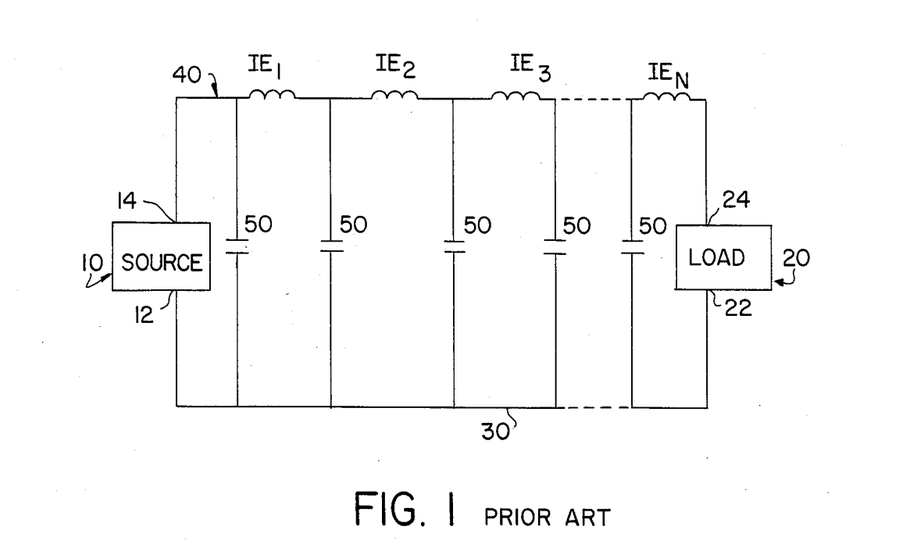
FIG. 1 is a schematic diagram of a conventional pulse forming network.

A conventional PFN is shown in FIG. 1. The PFN illustrated in FIG. 1 comprises a source of electrical energy 10 having a first source terminal 12 and a second source terminal 14. The terminals have differing polarities. Connected to the PFN (or forming a part of it depending on the particular conceptualization) is a load 20 having a first load terminal 22 and a second load terminal 24. First source terminal 12 is directly connected to first load terminal 22 by a direct connection 30. The second source terminal 14 is connected to second load terminal 24 through a linear array 40 of N series-connected inductor elements $IE_1$ through $IE_N$. Both the direct connection 30 and the linear array 40 are shown with a broken line to indicate that array 40 can be made up of an arbitrary number N of inductor elements. The PFN of FIG. 1 also comprises capacitors 50 which shunt high frequency components and, with the inductor elements $IE_1$ through $IE_N$, define a characteristic time constant for the PFN. Pulse shapes are determined by judicious selection of component values with regard to the impedance characteristics of the load in a manner readily apparent to one of ordinary skill in the art. Additional capacitors may also be used to control pulse shape.

Devices such as that shown in FIG. 1 are typically useful in repetitive pulse power applications, such as particle accelerators or the like, pulsers, microwave generators for various applications, and laser pumping. The present invention can also be used for the same applications. However, the device according to the present invention is inherently more efficient than conventional PFN's. Also, since the invention is all inductive, it is potentially lighter than devices using capacitors for the energy storage and transfer.

Figure 2:
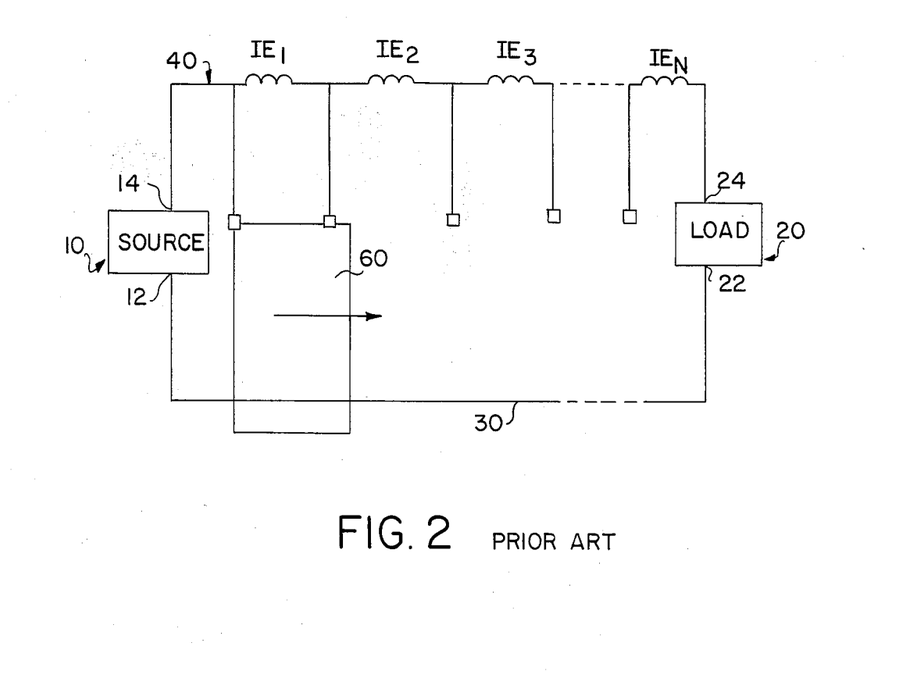
FIG. 2 is a partial schematic diagram of an inductor-based current amplifying device.
Figure 3A:
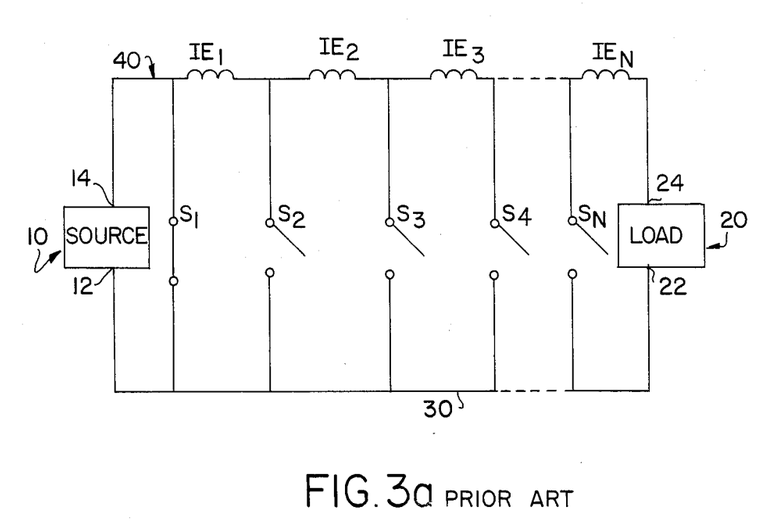
FIGS. 3a–3c are partial schematic diagrams showing operation of a variation of the device shown in FIG. 2.
Figure 3B:
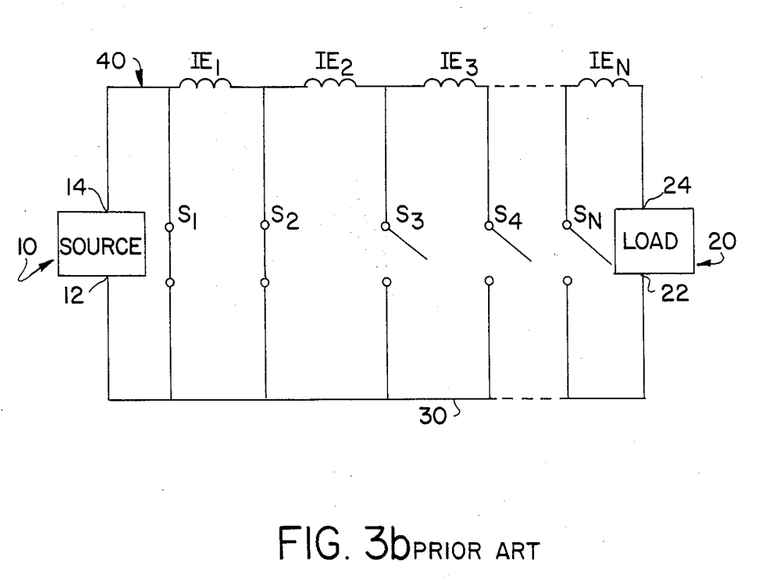
Figure 3C:
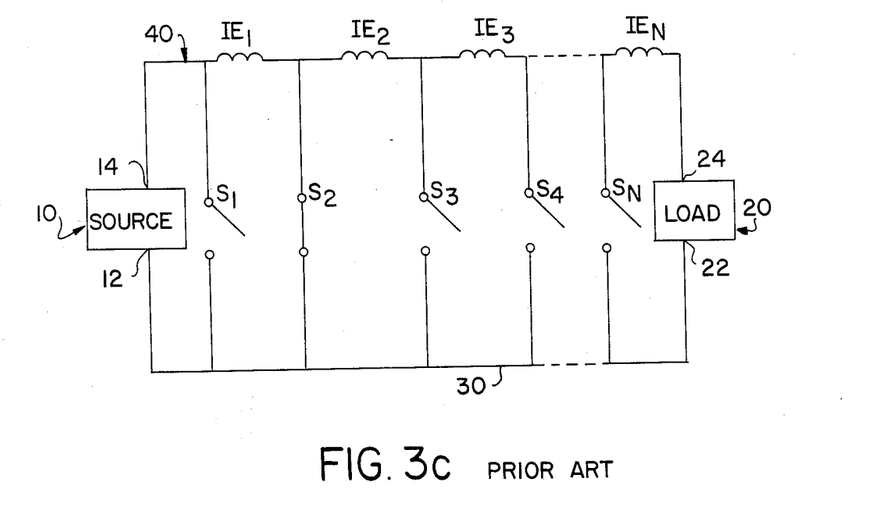

The present invention is based upon a recently developed current amplifying apparatus which successively open circuits an inductor or inductor array. Such a system is disclosed in U.S. Pat. No. 4,431,960 issued Feb. 14, 1984, the specification of which is incorporated herein by reference in its entirety. FIG. 2 shows a basic arrangement of such a circuit. In FIGS. 1 and 2, like numerals have been used for like elements. The device of FIG. 2 has no capacitors in its parallel branches, but instead has a shorting bar 60 which sequentially shorts and then opens inductor elements $IE_1$ through $IE_N$. In addition, the inductor elements are all magnetically coupled to one another. As illustrated in FIGS. 3a-3c, the shorting bar 60 may be conceived of as a bank of N switches $S_1$ through $S_N$ designed to close and open in a predetermined sequence. The theory of operation of the circuits of FIGS. 2 and 3a-3c is adequately set forth in the aforementioned U.S. patent and so will not be repeated here except to say that the proper switching action of switches $S_1$ through $S_N$ open circuits loops containing inductor elements $IE_1$ through $IE_N$ in turn and causes each element to transfer its energy via magnetic coupling to all of the remaining inductor elements. This ideally results in energy compression and causes amplification and propagation of a current pulse to the load 20.

The purely inductive device just described is an improvement over conventional PFN's in terms of size, weight, and theoretically achievable efficiencies. It is, however, designed to deliver a pulse to purely inductive loads. There still exists a need for a system having the advantages of a purely inductive modulator but which can deliver shaped pulses to loads which are not purely inductive.

SUMMARY OF THE INVENTION

It is an object of the present invention to provide a purely inductive modulator which can deliver current pulses of any predetermined shape to any load and, specifically, in square or step pulses.

It is a further object of the present invention to provide a purely inductive modulator which is extremely efficient.

It is a further object of the present invention to provide a purely inductive modulator in which any back-induced currents along with any accompanying negative effects can be minimized with only minimal losses in efficiency.

These and other objects are achieved in the present invention through a device based upon a distribution of mutually coupled inductors by which a shaped pulse to a predetermined load can be achieved by using constant voltage opening switch elements. The underlying circuit is based on that disclosed in the aforementioned U.S. Pat. No. 4,431,960, but can deliver a constant current (or any other desired current profile) to a resistive, dynamic or varying inductive load. The preferred constant voltage opening switch elements to be used are compound devices which are made up of a conventional opening switch (such as a fuse, gate turn off device (GTO), or the like) in parallel with the constant voltage device (such as a metal oxide varistor, back-to-back zener diodes, a battery, or a capacitor).

The device comprises a circuit which may be conceived of as a chain of repeating units. Each unit may be regarded as contributing one step in the formation of the pulse. According to the present invention, the number of such units and so the number of such steps can be made arbitrarily large. This makes it possible to approximate any desired pulse shape to any desired degree of precision.

Specifically, according to the present invention, there is provided a device for delivering a current pulse having a predetermined current profile, to a load having a first load terminal and a second load terminal. The device comprises a source of electrical energy having a first source terminal and second source terminal, the first source terminal being directly electrically connected to the first load terminal by a direct connection, a linear conductor array interposed between the second source terminal and the second load terminal, the array comprising an arbitrary number N of mutually magnetically coupled inductor elements, each having an associated closing switch element and opening switch element. Each of the closing switch elements is arranged to connect an associated inductor element to the aforesaid direct connection. In one embodiment of the invention, each of a like number N of constant voltage opening switch elements is interposed in series between an associated closing switch element and the direct connection for disconnecting a respective inductor element from the direct connection. In an alternative embodiment of the present invention, a like number N of constant voltage opening switch elements are distributed such that a first of the constant voltage opening switch elements is connected between the second source terminal and the first of the inductor elements, with the other constant voltage opening switch elements being respectively interposed between pairs of inductor elements.

BRIEF DESCRIPTION OF THE DRAWINGS

These and other features and advantages of the present invention will be more clearly understood from the accompanying drawings, in which.

DETAILED DESCRIPTION OF THE PRESENTLY PREFERRED EMBODIMENTS

Figure 4:
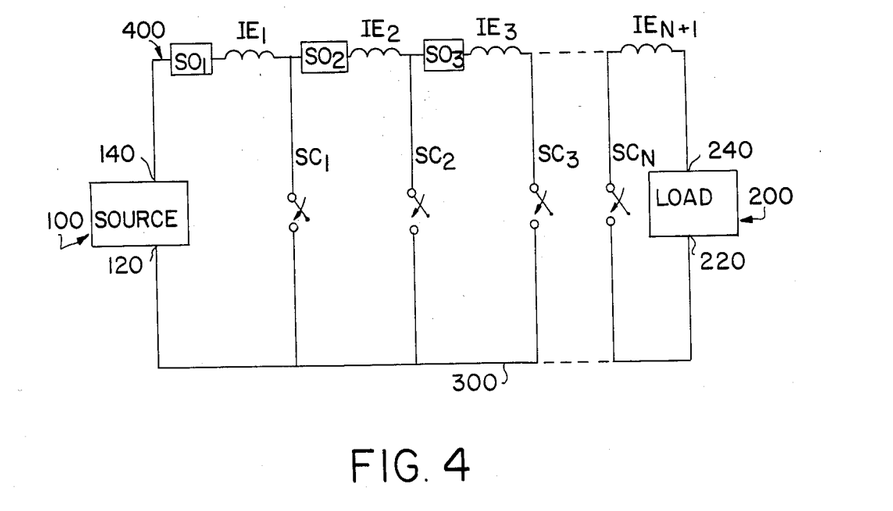
FIG. 4 is a schematic diagram of a first embodiment of a modulator according to the present invention.

FIG. 4 shows one embodiment of a modulator according to the present invention. The modulator features a source of electrical energy 100 having a first terminal 120 and second terminal 140. It also features a load 200 having a first load terminal 220 and a second load terminal 240. The first source terminal 120 is directly connected to the first load terminal 220 through a first direct connection 300. The embodiment also features a linear array 400 of N+1 inductor elements $IE_1$ through $IE_{N+1}$, and a bank of closing switches $SC_1$ through $SC_N$ to sequentially form current loops including inductor elements $IE_1$ through $IE_{N+1}$.

The embodiment of FIG. 4 also includes a plurality N of constant voltage opening switch elements $SO_1$ through $SO_N$. These switches sequentially open circuit the loops containing the inductor elements so as to sequentially transfer electrical energy from the inductor elements to the load 200 in FIG. 4. The preferred configuration of these constant voltage opening switch elements will be described below in connection with FIG. 5.

It will be noted that there is a dashed line between inductor elements $IE_3$ and $IE_{N+1}$ and also interrupting direct connection 300. This reflects the fact that the device may be conceived of as a chain of repeating units, each unit comprising an inductor element $IE_m$ and its associated closing switch $SC_m$ and opening switch $SO_m$ (m being an integer between 1 and N, inclusive). Each unit will contribute one step to the ultimate pulse configuration. In general, an N step modulator circuit will include N+1 inductor elements in series, each inductor element $IE_m$ being mutually magnetically coupled to all of the other inductor elements. Initially, the closing switches $SC_1$ through $SC_N$ are open and the opening switches $SO_1$ through $SO_N$ are closed. To begin the transfer process, the first closing switch $SC_1$ is closed. This defines a first loop. Then, associated opening switch $SO_1$ is opened. This allows the current in the first loop defined by the first closing switch $SC_1$, first inductor element $IE_1$, and first constant voltage opening switch element $SO_1$ to decay, which effects energy transfer to the load via the mutual magnetic inductance. This process is repeated successively for each loop down the line until the inductor element $IE_N$ transfers its energy to the load.

The device of FIG. 4 incorporates a number N of constant voltage opening switch elements $SO_1$ through $SO_N$. This is because proper modulator operation requires that the voltages on the switches be held at a constant or quasi-constant value. This is accomplished by shunting a conventional opening switch 90 with a constant voltage resistor or CVR 150 (also known as a varistor) in the manner shown in FIG. 5. A CVR is a non-linear circuit element with electrical characteristics similar to back-to-back zener diodes. Commercially available CVRs have high power capabilities and are used in many high power, pulse power applications. In addition to keeping the voltage across the switch constant, CVR 150 absorbs a majority of the energy which would otherwise have to be dissipated by opening switch 90. Thus, the CVR reduces the necessary power handling rating of the opening switch 90. It will be apparent to one of ordinary skill in the art that many components could serve as the constant voltage resistor, including metal oxide varistors, back-to-back zeners, batteries and capacitors.

Figure 5:
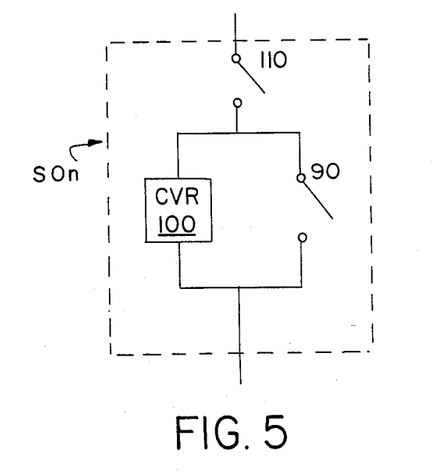
FIG. 5 is a schematic diagram of a preferred arrangement for a constant voltage opening switch element according to the present invention.
Figure 6:
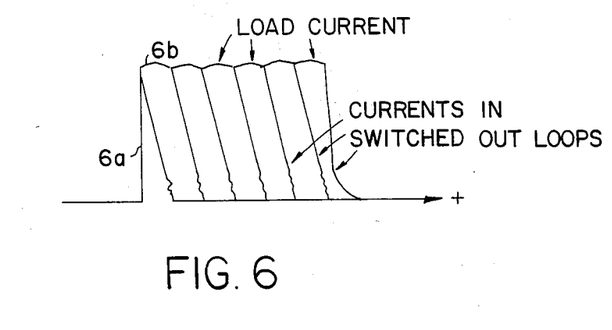
FIG. 6 is a graphical representation of a typical current profile achievable with the present invention.

FIG. 6 is a graphical representation of a square pulse generated by a circuit such as that illustrated in FIGS. 4 and 5. As can be seen, the current contribution from the first inductor element $IE_1$ can be used to produce the leading edge 600 of the square pulse. When the first inductor element $IE_1$ is switched out, that is, when the loop of which inductor element $IE_1$ forms a part is opened, the current in the first loop decays, and first inductor element $IE_1$ simultaneously transfers its energy to the remaining inductor elements $IE_2$ through $IE_{N+1}$ and the load via magnetic coupling. The component values are chosen such that the current in the rest of the circuit and the load remains substantially constant during the step. Similarly, inductor element $IE_2$ is switched out in such a manner as to keep the load current constant. This process continues until the final loop, after which the current falls off to zero. In effect, the resulting square pulse is made up of a series of shorter square pulses, one from each of the inductor loops. Each inductor loop makes an individual contribution to the final current profile of the pulse. The duration of each contribution, and the current it will produce, is established by selecting proper values for the inductances of the inductor elements and for the voltages of the constant voltage opening switch elements. It will readily be appreciated by one of skill in the art how inductor element value and voltage levels may be adjusted to achieve a pulse of any desired shape.

A difficulty which arises in a device operating such as that just described is back-induced currents. As the current of one loop of the modulator circuit is decreased (due to the open switch voltage in the loop), voltage is induced in each of the other circuit loops. This voltage tends to offset the normal decay of the load current. The values of the switch components and inductors may be chosen such that the voltage induced in the load loop produces the desired current profile. In a similar fashion, however, voltage is induced in each of the back, previously opened loops. These loops are not fully opened, due to the presence of CVR 150. It therefore remains possible that open-circuiting inductors down the line may induce currents in these loops. This may result in some portion of the energy being transferred backward to previously switched-out inductors instead of forward to the load. Since the previous constant voltage switches are still in operation, induced currents may once again be driven down resulting in a distorted, stretched out load pulse.

In the device just described, the back-induced current problem may be substantially eliminated by proper selection of values for the individual inductances of inductor elements $IE_1$ through $IE_{N+1}$ and individual voltages for the constant voltage opening switch elements $SO_1$ through $SO_N$. For each application, there is a specific combination of component values which will minimize the back induced currents. This issue can be avoided entirely, however, by the following method. The constant voltage opening switch elements $SO_1$ through $SO_N$ may each further include an opening switch 110 in series with the constant voltage opening switch 90. This is shown in FIG. 5. With the incorporation of a constant voltage opening switch elements each containing a switch 110, the back loops are opened once the current therein has decayed to zero. Thus, these loops no longer exist as such, and no current can flow within them.

Figure 7:
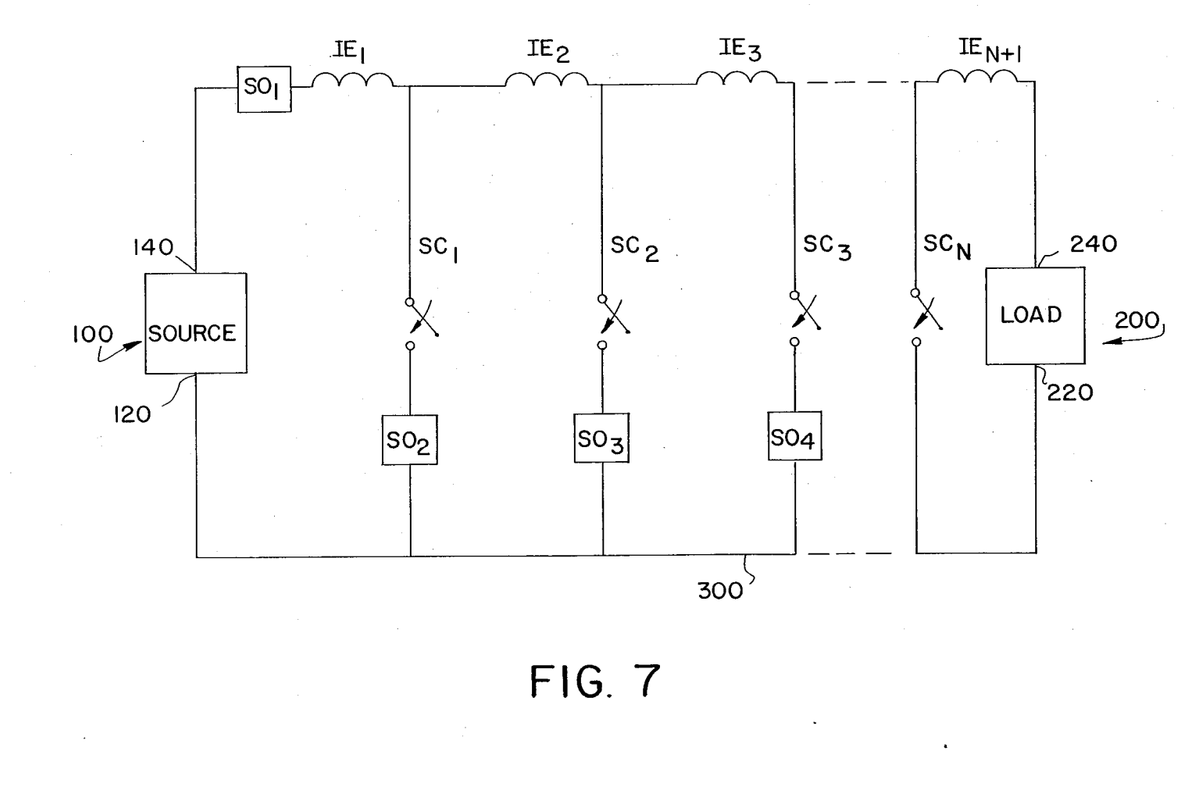
FIG. 7 is a schematic diagram of a second embodiment of a modulator according to the present invention.

In general, if such an opening switch 110 is included in the circuit, then it is generally more desirable to use a parallel circuit embodiment such as that shown in FIG. 7. This embodiment places less of a constraint on the opening switches than does the series embodiment of FIG. 4. The reason for this is that in the series embodiment, the opening switch components must carry the full circuit current over the entire duration of the pulse. In the parallel embodiment, the opening switch components need carry the circuit current only for the duration of one switching step. Additionally, since the opening switch elements are in series in the series embodiment, their resistances are additive and thus increase the net circuit resistance more than in the parallel embodiment.

As shown in FIG. 7, the constant voltage opening switch elements are included in the parallel branches of the device, each in series with a respective closing switch element. In operation, the first closing switch $SC_1$ is closed and then the first constant voltage opening switch element $SO_1$ is opened. The constant voltage maintained across first opening switch $SO_1$ drives the current in the loop containing $SC_1$, $SO_1$, and $IE_1$ downward. When the current has reached zero, the second opening switch element 110 of $SO_1$ is opened, thus fully opening the loop and avoiding any back-induced currents. The demands on the second opening switch element 110 are minimal as it is required to open only when no current is flowing through it. The process is repeated as before until all of the loops have been formed and then opened.

Several multi-step modulators have been constructed. It has been demonstrated that it possible to design modulators for a wide range of loads (resistive loads, varying inductive/electromagnetic loads, and the like) and current profiles. Each modulator can be tailored to a specific application in which the L/R time, voltage handling capability, current density, and switch voltages may all be chosen to optimize system performance.

Figure 8:
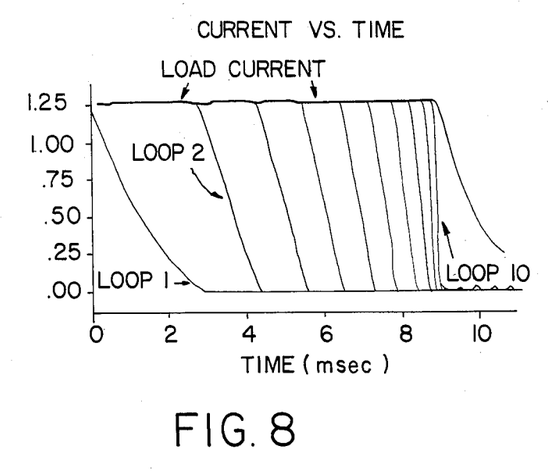
FIG. 8 is a graphical representation of a typical current pulse achievable with the present invention.

As a concrete example, reference is made to FIG. 8 which shows current versus time for a ten-step modulator of the type illustrated in FIG. 4. The particular modulator for which the data was calculated was designed to drive an electromagnetic gun at a quasi-constant current. The initial stored energy was 111 megajoules (MJ). Computer modeling indicates such a system to be 87% efficient in terms of the energy delivered to the load from all of the inductor elements. The initial inductance was 142 microhenries with the inductance of final element being 1.27 microhenries. L/R was designed to be 229 milliseconds. The following table shows the inductance, width, and radius of each of the inductors in the ten-step modulator:

| INDUCTOR # | INDUCTANCE (H) | WIDTH (cm) | RADIUS (cm) |
| --- | --- | --- | --- |
| 1 | 1.27E-6 | 5.7 | 50.0 |
| 2 | 1.49E-6 | 5.7 | 55.8 |
| 3 | 1.68E-6 | 6.0 | 61.7 |
| 4 | 1.83E-6 | 7.1 | 67.7 |
| 5 | 1.92E-6 | 7.2 | 75.1 |
| 6 | 1.95E-6 | 7.4 | 82.6 |
| 7 | 1.92E-6 | 8.5 | 90.1 |
| 8 | 1.83E-6 | 8.6 | 98.9 |
| 9 | 1.68E-6 | 8.6 | 108.0 |
| 10 | 1.49E-6 | 8.6 | 117.0 |
| 11 | 1.27E-6 | 8.6 | 126.1 |

The following table shows the voltages, currents, opening times and time carrying current for each of the opening switches:

| SWITCH # | Vs (KV) | Is (MA) | OPENING TIME (msec) | TIME CARRYING CURRENT (msec) |
| --- | --- | --- | --- | --- |
| 1 | 559 | 1.25 | 2.84 | 200 |
| 2 | 1209 | 1.25 | 1.54 | 2.84 |
| 3 | 1708 | 1.25 | 1.18 | 1.54 |
| 4 | 2408 | 1.25 | 0.95 | 1.18 |
| 5 | 3110 | 1.25 | 0.77 | 0.95 |
| 6 | 3970 | 1.25 | 0.61 | 0.77 |
| 7 | 5100 | 1.25 | 0.47 | 0.61 |
| 8 | 6800 | 1.25 | 0.34 | 0.47 |
| 9 | 9950 | 1.25 | 0.21 | 0.34 |
| 10 | 18625 | 1.25 | 1.10 | 0.21 |
| 11 | 0.0 | 1.25 | — | 0.10 |

The total transfer time was 9 milliseconds. As can be seen from FIG. 8, a very good approximation to a square pulse was achieved.

Figure 9:
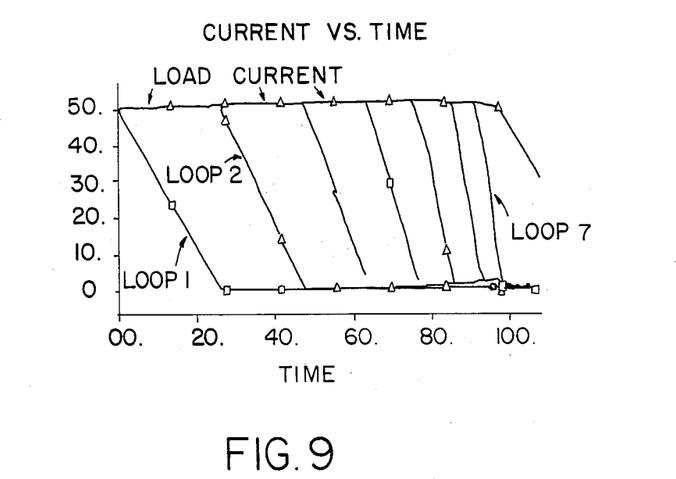
FIG. 9 is a graphical representation of a typical current pulse achievable with the present invention.

FIG. 9 shows the current waveforms for a seven-step modulator which has been constructed and demonstrated to deliver a constant current to a resistive load with 78% efficiency. The following table gives modulator inductance values:

| 7.61E-05 | 5.81E-05 | 4.40E-05 | 3.34E-0 | 2.56E-05 | 1.97E-05 | 1.52E-05 | 4.60E-05 |
|---|---|---|---|---|---|---|---|
| 5.81E-05 | 5.94E-05 | 4.44E-05 | 3.35E-05 | 2.55E-05 | 1.95E-05 | 1.50E-05 | 4.53E-05 |
| 4.40E-05 | 4.44E-05 | 4.44E-05 | 3.31E-05 | 2.50E-05 | 1.91E-05 | 1.45E-05 | 4.38E-05 |
| 3.34E-05 | 3.35E-05 | 3.31E-05 | 3.31E-05 | 2.47E-05 | 1.87E-05 | 1.42E-05 | 4.26E-05 |
| 2.56E-05 | 2.55E-05 | 2.50E-05 | 2.47E-05 | 2.47E-05 | 1.85E-05 | 1.39E-05 | 4.16E-05 |
| 1.97E-05 | 1.95E-05 | 1.91E-05 | 1.87E-05 | 1.85E-05 | 1.85E-05 | 1.38E-05 | 4.09E-05 |
| 1.52E-05 | 1.50E-05 | 1.45E-05 | 1.42E-05 | 1.39E-05 | 1.38E-05 | 1.38E-05 | 4.06E-05 |
| 4.60E-05 | 4.53E-05 | 4.38E-05 | 4.26E-05 | 4.16E-05 | 4.09E-05 | 4.06E-05 | 1.60E-04 |

Inductance values on the main diagonal are self inductances. Inductance values off of the main diagonal are mutual inductances. The switch voltages were 136 volts.

Figure 10:
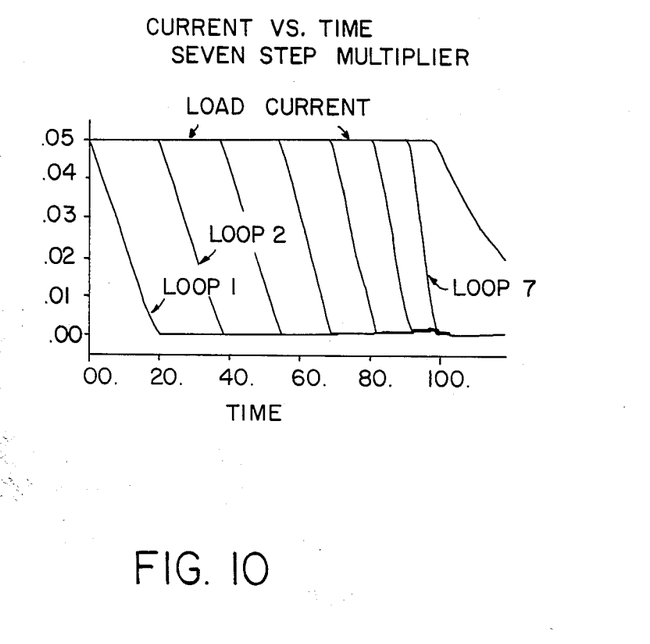
FIG. 10 is also a graphical representation of a typical current pulse achievable with an embodiment of the present invention.

FIG. 10 represents a current pulse obtained with a seven-step modulator of the type illustrated in FIG. 7, that is incorporating parallel switch combination in order to enhance efficiency. The constant voltage opening switch element used included an opening switch such as opening switch 110 in FIG. 5 so that each back loop was in turn fully opened once the current in the loop decayed to zero. Efficiency was measured to be 83%.

The present invention is especially well adapted to take advantage of recent breakthroughs towards materials exhibiting high temperature superconductivity. The characteristic time constant of the circuit imposes physical limitation on the speed at which a purely inductive modulator can be charged up initially and the rate at which the energy stored therein decays. The time constant is the ratio or quotient of the inductance and resistance, L/R. As the resistance is made smaller, the denominator becomes smaller, and hence L/R increases. This means that smaller values of L, and, hence, smaller inductors, may be used to obtain the same overall time constant. This opens the way for devices potentially lighter, even more compact, than those achievable without superconducting elements.

The foregoing discloses two embodiments of the present invention and are intended as exemplary embodiments only. It will be readily apparent to one skilled in the art that it will be possible to utilize the teachings of the invention apart from the specific exemplary embodiments discussed above. Therefore, the present invention should not be deemed limited to these exemplary embodiments, but instead should be deemed fully commensurate in scope with the following claims.

What is claimed is:

1. A device for delivering a current pulse having a predetermined current profile to a load having a first load terminal and a second load terminal, said device comprising:
   an energy source having a first source terminal and a second source terminal, said first source terminal being electrically connected to said first load terminal by a direct connection; and
   a plurality of inductor units arranged in series between said second source terminal and said second load terminal, each of said inductor units comprising an inductor element, a closing switch element, and a constant voltage opening switch element.

2. The device as claimed in claim 1 wherein in each inductor unit, said inductor element and said constant voltage opening switch element are arranged in series and wherein said closing switch element is arranged to connect said inductor element to said direct connection.

3. The device as claimed in claim 1 wherein in each inductor unit, said closing switch element and said constant voltage opening switch element are arranged in series between said inductor element and said direct connection.

4. A device for delivering a current pulse having a predetermined current profile to a load having a first load terminal and a second load terminal, said device comprising:
   a source of electrical energy having a first source terminal and a second source terminal, said first source terminal being electrically connected to said first load terminal by a direct connection;
   a linear inductor array interposed between said second source terminal and said second load terminal, said array comprising N mutually magnetically coupled inductor elements, N being a positive integer; N closing switch elements, each of said closing switch elements being arranged to connect an associated inductor element to said direct connection; and N constant voltage opening switch elements, each of said opening switch elements being interposed in series between an associated closing switch element and said direct connection for disconnecting an inductor element associated with said associated closing switch element from said direct connection.

5. The device claimed in claim 4 wherein each said constant voltage opening switch elements comprise an opening switch in parallel with a constant voltage device.

6. A device as claimed in claim 5 wherein said constant voltage device comprises a metal oxide varistor.

7. A device as claimed in claim 5 wherein said constant voltage device comprises back-to-back zener diodes.

8. A device as claimed in claim 5 wherein said constant voltage device comprises a battery.

9. A device as claimed in claim 5 wherein said constant voltage device comprises a capacitor.

10. A device for delivering a current pulse having a predetermined current profile to a load having a first load terminal and a second load terminal said device comprising:
    a source of electrical energy having a first source terminal and a second source terminal, said first source terminal being electrically connected to said first load terminal by a direct connection;
    a linear inductor array interposed between said second source terminal and said second load terminal, said array comprising N mutually magnetically coupled inductor elements, N being a positive integer; N closing switch elements, each of said closing switch elements being arranged to connect an associated inductor element to said direct connection; and N constant voltage opening switch elements, a first of said constant voltage opening switch elements being connected between the second terminal of said source and a first of said inductor elements, and the remaining constant voltage switching element being interposed between pairs of inductor elements.

11. The device as claimed in claim 10 wherein said constant voltage opening switch element comprises an opening switch in parallel with a constant voltage device.

12. A device as claimed in claim 11 wherein said constant voltage device comprises a metal oxide varistor.

13. A device as claimed in claim 11 wherein said constant voltage device comprises back-to-back zener diodes.

14. A device as claimed in claim 11 wherein said constant voltage device comprises a battery.

15. A device as claimed in claim 11 wherein said constant voltage device comprises a capacitor.

16. A method using a plurality of inductor elements to deliver to a load a current pulse having a predetermined current profile, comprising of the steps of:
   (a) storing electrical energy in a linear array of inductor units;
   (b) sequentially shunting one of said inductor elements by closing an associated closing switch;
   (c) opening an associated constant voltage opening switch element; and
   (d) repeating said steps (b) and (c) until all of said plurality of constant voltage opening switch elements have been opened.

17. The method as claimed in claim 16, further comprising a step, before said step (a), of arranging each of said constant voltage opening switch elements in series with an associated inductor element.

18. The method as claimed in claim 16, further comprising a step, before said step (a), of shunting each of said inductor units with a series combination of a constant voltage opening switch element and a closing switch element.

* * * * *